United States Patent
Swatowski et al.

(10) Patent No.: US 11,480,873 B2
(45) Date of Patent: Oct. 25, 2022

(54) METHOD FOR OPTICAL WAVEGUIDE FABRICATION

(71) Applicants: Dow Global Technologies LLC, Midland, MI (US); Dow Silicones Corporation, Midland, MI (US)

(72) Inventors: Brandon W. Swatowski, Sanford, MI (US); Kai Su, Midland, MI (US); Maynard G. Hyer, Sanford, MI (US); William K. Weidner, Bay City, MI (US)

(73) Assignees: Dow Global Technologies LLC, Midland, MI (US); Dow Silicones Corporation, Midland, MI (US)

( * ) Notice: Subject to any disclaimer, the term of this patent is extended or adjusted under 35 U.S.C. 154(b) by 409 days.

(21) Appl. No.: 16/629,151

(22) PCT Filed: Jul. 9, 2018

(86) PCT No.: PCT/US2018/041249
§ 371 (c)(1),
(2) Date: Jan. 7, 2020

(87) PCT Pub. No.: WO2019/040192
PCT Pub. Date: Feb. 28, 2019

(65) Prior Publication Data
US 2020/0292936 A1    Sep. 17, 2020

Related U.S. Application Data

(60) Provisional application No. 62/549,646, filed on Aug. 24, 2017.

(51) Int. Cl.
| | |
|---|---|
| G03F 7/16 | (2006.01) |
| G03F 7/20 | (2006.01) |
| G03F 7/32 | (2006.01) |
| G03F 7/038 | (2006.01) |
| G03F 7/004 | (2006.01) |
| G02B 6/13 | (2006.01) |
| G02B 6/138 | (2006.01) |
| C08L 83/04 | (2006.01) |
| C08L 83/07 | (2006.01) |
| G03F 7/00 | (2006.01) |
| G03F 7/075 | (2006.01) |
| G02B 6/12 | (2006.01) |

(52) U.S. Cl.
CPC ............ *G03F 7/0007* (2013.01); *C08L 83/04* (2013.01); *G02B 6/13* (2013.01); *G02B 6/138* (2013.01); *G03F 7/038* (2013.01); *G03F 7/0757* (2013.01); *G03F 7/162* (2013.01); *G03F 7/168* (2013.01); *G03F 7/2004* (2013.01); *G03F 7/325* (2013.01); *C08L 2205/025* (2013.01); *C08L 2205/03* (2013.01); *G02B 2006/12069* (2013.01); *G02B 2006/12173* (2013.01)

(58) Field of Classification Search
CPC .................................. C08L 83/04; G02B 6/13
See application file for complete search history.

(56) References Cited

U.S. PATENT DOCUMENTS

| | | | |
|---|---|---|---|
| 8,175,439 B2 | 5/2012 | Fujiue et al. | |
| 10,754,094 B2 * | 8/2020 | Su | ............ G02B 1/046 |
| 10,852,480 B2 * | 12/2020 | Su | .......... G03F 7/0757 |
| 2003/0234458 A1 * | 12/2003 | Gardner | ................ G02B 1/046 264/2.6 |
| 2003/0235383 A1 | 12/2003 | Gardner et al. | |
| 2012/0301094 A1 * | 11/2012 | De Groot, Jr. | ......... G02B 1/045 385/129 |
| 2014/0154626 A1 * | 6/2014 | Bujalski | ............... C09D 183/06 430/280.1 |
| 2015/0355379 A1 * | 12/2015 | Wolter | .................. G03F 7/0002 264/401 |

FOREIGN PATENT DOCUMENTS

| | | |
|---|---|---|
| EP | 1142928 | 10/2001 |
| EP | 1523525 | * 4/2005 |

(Continued)

OTHER PUBLICATIONS

Soma, et al., Fabrication of a Graded-Index Circular-Core Polymer Parallel Optical Waveguide Using a Microdispenser for a High-Density Optical Printed Curcuit Board, IEEE Journal of Selected Topics in Quantum Electronics, vol. 19, No. 2, Mar./Apr. 2013.

(Continued)

*Primary Examiner* — Martin J Angebranndt

(57) ABSTRACT

A method for producing an optical waveguide by: (a) depositing a first composition: (i) a polysiloxane comprising epoxy and alkenyl groups with refractive index no greater than 1.50, (ii) a compound comprising at least one epoxy group and refractive index no greater than 1.49, and (iii) a polysiloxane having refractive index at least 1.50; (iv) a photo acid generator; (v) a hydrosilylation catalyst, (vi) an inhibitor for hydrosilylation; (b) curing by exposure to ultraviolet light; (c) removing the uncured portion to produce a patterned core layer; (d) after a time from 20 to 300 hours depositing a second composition comprising: (i) a polysiloxane comprising epoxy groups with refractive index no greater than 1.49, and (ii) a compound comprising at least two epoxy groups with a refractive index no greater than 1.49 and an alcohol having refractive index no more than 1.45 (iii) at least one photo acid generator.

10 Claims, No Drawings

(56) References Cited

FOREIGN PATENT DOCUMENTS

| WO | 2008/027280 | * | 3/2008 |
| WO | 2009021256 | | 2/2009 |
| WO | 2009059089 | | 5/2009 |
| WO | 2019040191 | | 2/2019 |
| WO | 2019040193 | | 2/2019 |

OTHER PUBLICATIONS

Kinoshita, et al., Polymer Optical Waveguides With GI and W-Shaped Cores for High-Bandwidth-Density On-Board Interconnects, Journal of Lightwave Technology, vol. 31, No. 24, Dec. 15, 2013.
Tahayama, et al., Significant Reduction of Crossing Loss using Polynorbornene based GI-core Optical Waveguide, Information & Telecommunication Materials Lab., Sumitomo Bakelite Co., Ltd., Japan.
Mori, et al., Optical and electrical hybrid flexible printed circuit boards with unique photo-defined polymer waveguide layers, Invited Paper, Sumitomo Bakelite Co., Ltd., COIN project team, Japan, Proc of SPIE vol. 7607 7607OS-1 to 7907OS-11.

* cited by examiner

METHOD FOR OPTICAL WAVEGUIDE FABRICATION

This invention relates to a method for optical waveguide fabrication capable of producing optical waveguides having a refractive index gradient.

Waveguides having core and clad structures, in which the core has a higher refractive index than the clad have been produced by using materials with different refraction index and also allowing a species having a different refractive index to diffuse into either structure to form gradients, followed by curing. This method is used, e.g., in Ishigure et al., *IEEE Journal of Selected Topics in Quantum Electronics*.

The problem solved by this invention is the need for improved methods to produce optical waveguides having a refractive index gradient.

STATEMENT OF THE INVENTION

The present invention provides a method for producing an optical waveguide; said method comprising steps of: (a) depositing on a substrate a first composition comprising: (i) a first polysiloxane comprising epoxy groups and alkenyl groups, and having a refractive index no greater than 1.49; (ii) at least one first compound comprising at least one epoxy group and having molecular weight no greater than 1000 and a refractive index no greater than 1.49; (iii) a second polysiloxane having $M_n$ from 150 to 1,500, at least one hydrogen atom bonded to a silicon atom and a refractive index of at least 1.50; (iv) at least one photo acid generator; (v) at least one hydrosilylation catalyst; and (vi) at least one inhibitor for hydrosilylation; (b) curing the first composition by exposure to ultraviolet light through a mask to produce a patterned core layer comprising a cured portion of the first composition and an uncured portion of the first composition; (c) removing at least a part of the uncured portion of the first composition to produce a final patterned core layer; (d) after a time from 20 to 300 hours, depositing on the final patterned core layer a second composition that has refractive index at least 0.002 lower than that of the first composition comprising: (i) a third polysiloxane comprising epoxy groups, and having a refractive index no greater than 1.49, (ii) at least one second compound comprising at least one epoxy group and having molecular weight no greater than 1000 and a refractive index no greater than 1.49, (iii) a $C_3$-$C_{20}$ alcohol with refractive index not greater than 1.45, and (iv) at least one photo acid generator to produce a composite; (e) curing by exposure to ultraviolet light; and (f) heating at a temperature from 20 to 210° C. for 0.1 to 10 hours.

DETAILED DESCRIPTION

Percentages are weight percentages (wt %) and temperatures are in ° C. unless specified otherwise. Operations were performed at room temperature unless specified otherwise. Alkyl groups are saturated hydrocarbyl groups that may be straight or branched. Preferably, alkyl groups have from one to six carbon atoms, preferably one or two. Preferably, alkyl groups are unsubstituted. Aryl groups are substituent groups derived from aromatic hydrocarbon compounds which can be mono- or poly-nuclear. Aryl groups may be substituted by $C_1$-$C_4$ alkyl and/or $C_1$-$C_4$ alkoxy groups. Preferably, aryl groups are unsubstituted.

As used herein, unless otherwise indicated, molecular weights, $M_n$, $M_w$ and $M_z$ have the conventional meanings and are determined by gel permeation chromatography. Molecular weights are reported herein in units of g/mol. Refractive indices are measured at 25° C. at the sodium D-line (589 nm).

In a preferred embodiment of the invention, the substrate comprises a non-reactive material which is coated with a lower clad composition cured to form a lower clad layer. Preferably, the non-reactive material is silicon, glass, polyimide or FR4 board. Preferably, the non-reactive material is substantially planar, e.g., wafer, board, disk or film. Preferably, the lower clad composition is a cured film derived from a composition that comprises: (i) a polysiloxane comprising epoxy groups and alkenyl groups, and having a refractive index no greater than 1.49, (ii) at least one compound comprising at least one epoxy group and having molecular weight no greater than 1000 and a refractive index no greater than 1.49, and (iii) at least one $C_3$-$C_{20}$ alcohol. The alcohol may be linear or branched, primary, secondary and tertiary. Preferably, the polysiloxane comprises from 15 to 40 mole % (preferably 18 to 35 mole %, preferably 20 to 32 mole %, preferably 21 to 29 mole %, preferably 22 to 27 mole %) of a unit having formula $R^1R^2R^3SiO_{1/2}$, wherein $R^1$ and $R^2$ independently are $C_1$-$C_{12}$ alkyl, preferably $C_1$-$C_6$ alkyl, preferably $C_1$-$C_4$ alkyl, preferably methyl or ethyl, preferably methyl; and $R^3$ is $C_2$-$C_{12}$ alkenyl, preferably $C_2$-$C_6$ alkenyl, preferably $C_2$-$C_4$ alkenyl, preferably vinyl. Preferably, the polysiloxane comprises from 2 to 20 mole % (preferably 4 to 18 mole %, preferably 5 to 17 mole %, preferably 6 to 15 mole %, preferably 7 to 14 mole %) of a unit having formula $ArSiO_{3/2}$, wherein Ar is $C_6$-$C_{20}$ aryl, preferably $C_6$-$C_{15}$ aryl, preferably $C_6$-$C_{12}$ aryl, preferably phenyl. Preferably, the polysiloxane comprises from 25 to 60 mole % (preferably 30 to 55 mole %, preferably 33 to 50 mole %, preferably 36 to 46 mole %) of a unit having formula $EpSiO_{3/2}$, wherein Ep is $C_3$-$C_{20}$ alkyl substituted with an epoxy group, preferably $C_4$-$C_{15}$ alkyl substituted with an epoxy group, preferably $C_5$-$C_{10}$ alkyl substituted with an epoxy group, preferably $C_5$-$C_{10}$ alkyl comprising cyclohexyl fused to an ethylene oxide ring, preferably 2-(3,4-epoxycyclohexyl)ethyl. Preferably, the polysiloxane comprises from 10 to 40 mole % (preferably 13 to 37 mole %, preferably 16 to 34 mole %, preferably 18 to 32 mole %) of a unit having formula $R^4SiO_{3/2}$, wherein $R^4$ is $C_1$-$C_{12}$, alkyl, preferably $C_1$-$C_6$ alkyl, preferably $C_1$-$C_4$ alkyl, preferably methyl or ethyl, preferably methyl. Preferably, the compound comprising at least one epoxy group, having molecular weight no greater than 700 and a refractive index no greater than 1.49 has a molecular weight from 100 to 600, preferably 150 to 530, preferably 200 to 480. Preferably, the compound has a refractive index no greater than 1.48, preferably no greater than 1.47, preferably no greater than 1.46; preferably at least 1.3, preferably at least 1.35. Preferably, the compound has at least one epoxy groups, preferably two. Preferably, the compound is a silicon-containing compound, preferably a siloxane compound. Preferably, hydrocarbyl substituents attached to silicon which do not comprise epoxy groups are $C_1$-$C_4$ alkyl groups, preferably methyl. Preferably, the epoxy group is part of a $C_3$-$C_{20}$ alkyl group, preferably $C_4$-$C_{15}$ alkyl, preferably $C_4$-$C_{10}$ alkyl, preferably $C_5$-$C_{10}$ alkyl comprising cyclohexyl fused to an ethylene oxide ring, preferably 2-(3,4-epoxycyclohexyl) ethyl. Preferably, the compound is 1,3-bis(2-(3,4-epoxycyclohexyl)ethyl) tetramethyldisiloxane. Preferably the refractive index of the lower clad composition is at least 0.002 lower than the first composition.

Preferably, the lower clad composition is the same as the second composition. Preferably, the lower clad composition comprises from 30 to 80 wt % of polysiloxane(s) comprising epoxy groups, and having a refractive index no greater than 1.49, preferably at least 50 wt %, preferably at least 58.1 wt %; preferably no more than 70 wt %, preferably no more than 80 wt %. Preferably, the lower clad composition comprises from 5 to 60 wt % of compound(s) comprising at least one epoxy group and having molecular weight no greater than 700 and a refractive index no greater than 1.49, preferably at least 20 wt %, preferably at least 34 wt %; preferably no more than 50 wt %, preferably no more than 40 wt %. Preferably, the lower clad composition comprises from 0.5 to 25 wt % of at least one $C_3$-$C_{20}$ alcohol having and a refractive index no greater than 1.45, preferably at least 5 wt %, preferably at least 6.5 wt %; preferably no more than 10 wt %, preferably no more than 8 wt %. Preferably, the alcohol has one or two hydroxyl groups, preferably one. Preferably, the lower clad has from 0.02 to 5 wt % of photo acid generator; preferably at least 0.05 wt %, preferably at least 0.1 wt %; preferably no more than 3 wt %, preferably no more than 1 wt %. Preferably, the lower clad composition is cured by exposure to ultraviolet light to form a lower clad layer.

The first composition comprises: (i) a first polysiloxane comprising epoxy groups and alkenyl groups, and having a refractive index no greater than 1.49; (ii) at least one first compound comprising at least one epoxy group and having molecular weight no greater than 1000 and a refractive index no greater than 1.49; (iii) a second polysiloxane having $M_n$ from 150 to 1,500, at least one hydrogen atom bonded to a silicon atom and a refractive index of at least 1.50; (iv) at least one photo acid generator; (v) at least one hydrosilylation catalyst; and (vi) at least one inhibitor for hydrosilylation. The first composition is cured to form a patterned core layer. Preferably, the first polysiloxane comprising epoxy groups and alkenyl groups comprises 15 to 40 mole % (preferably 18 to 35 mole %, preferably 20 to 32 mole %, preferably 21 to 29 mole %, preferably 22 to 27 mole %) of a unit having formula $R^5R^6R^7SiO_{1/2}$, wherein $R^5$ and $R^6$ independently are $C_1$-$C_{12}$ alkyl, preferably $C_1$-$C_6$ alkyl, preferably $C_1$-$C_4$ alkyl, preferably methyl or ethyl, preferably methyl; and $R^7$ is $C_2$-$C_{12}$ alkenyl, preferably $C_2$-$C_6$ alkenyl, preferably $C_2$-$C_4$ alkenyl, preferably vinyl. Preferably, the first polysiloxane comprises from 2 to 20 mole % (preferably 4 to 18 mole %, preferably 5 to 17 mole %, preferably 6 to 15 mole %, preferably 7 to 14 mole %) of a unit having formula $Ar^1SiO_{3/2}$, wherein $Ar^1$ is $C_6$-$C_{20}$ aryl, preferably $C_6$-$C_{15}$ aryl, preferably $C_6$-$C_{12}$ aryl, preferably phenyl. Preferably, the first polysiloxane comprises from 25 to 60 mole % (preferably 30 to 55 mole %, preferably 33 to 50 mole %, preferably 36 to 46 mole %) of a unit having formula $Ep^1SiO_{3/2}$, wherein $Ep^1$ is $C_3$-$C_{20}$ alkyl substituted with an epoxy group, preferably $C_4$-$C_{15}$ alkyl substituted with an epoxy group, preferably $C_5$-$C_{10}$ alkyl substituted with an epoxy group, preferably $C_5$-$C_{10}$ alkyl comprising cyclohexyl fused to an ethylene oxide ring, preferably 2-(3,4-epoxycyclohexyl)ethyl. Preferably, the first polysiloxane comprises from 10 to 40 mole % (preferably 13 to 37 mole %, preferably 16 to 34 mole %, preferably 18 to 32 mole %) of a unit having formula $R^8SiO_{3/2}$, wherein $R^8$ is $C_1$-$C_{12}$ alkyl, preferably $C_1$-$C_6$ alkyl, preferably $C_1$-$C_4$ alkyl, preferably methyl or ethyl, preferably methyl. Preferably, the first compound comprising at least two epoxy groups and having molecular weight no greater than 700 and a refractive index no greater than 1.49 has a molecular weight from 100 to 600, preferably 150 to 530, preferably 200 to 480. Preferably, the first compound has a refractive index no greater than 1.48, preferably no greater than 1.47, preferably no greater than 1.46; preferably at least 1.3, preferably at least 1.35. Preferably, the first compound is a silicon-containing compound, preferably a siloxane compound. Preferably, hydrocarbyl substituents attached to silicon which do not comprise epoxy groups are $C_1$-$C_4$ alkyl groups, preferably methyl. Preferably, the epoxy group is part of a $C_3$-$C_{20}$ alkyl group, preferably $C_4$-$C_{15}$ alkyl, preferably $C_4$-$C_{10}$ alkyl, preferably $C_5$-$C_{10}$ alkyl comprising cyclohexyl fused to an ethylene oxide ring, preferably 2-(3,4-epoxycyclohexyl)ethyl. Preferably, the first compound is 1,3-bis(2-(3,4-epoxycyclohexyl)ethyl) tetramethyldisiloxane. Preferably, the second polysiloxane having molecular weight ($M_n$) from 150 to 1,500, at least one hydrogen atom bonded to a silicon atom and a refractive index of at least 1.50 has a refractive index of at least 1.51, preferably at least 1.52, preferably at least 1.53, preferably at least 1.54; preferably no more than 1.65, preferably no more than 1.62. Preferably, the second polysiloxane has at least two hydrogen atoms bonded to silicon atoms, preferably no more than four, preferably no more than three, preferably two. Preferably, the second polysiloxane has $M_n$ at least 300, preferably at least 400, preferably at least 500; preferably no more than 1200, preferably no more than 1000, preferably no more than 900. Preferably, the second polysiloxane comprises from one to ten difunctional siloxane units (D units), as a number average, preferably at least 1.5 D units, preferably at least 2.0; preferably no more than 5.0, preferably no more than 4.0, preferably no more than 3.5. Preferably, the second polysiloxane comprises D units having at least one $C_6$-$C_{20}$ aryl substituent (preferably $C_6$-$C_{15}$ aryl, preferably $C_6$-$C_{12}$ aryl, preferably phenyl), preferably two $C_6$-$C_{20}$ aryl substituents (preferably two $C_6$-$C_{15}$ aryls, preferably two $C_6$-$C_{12}$ aryls, preferably two phenyls). Preferably, each epoxy group is part of a $C_3$-$C_{20}$ alkyl group, preferably $C_4$-$C_{15}$ alkyl, preferably $C_4$-$C_{10}$ alkyl, preferably $C_5$-$C_{10}$ alkyl comprising cyclohexyl fused to an ethylene oxide ring, preferably 2-(3,4-epoxycyclohexyl)ethyl. Preferably, the silicon-hydrogen bonds in the second polysiloxane are on terminal silicon atoms. Preferably, the second polysiloxane has formula $HMe_2SiO(Ph_2SiO_{2/2})_nOSiMe_2H$ in which Ph is phenyl and n is 1.0 to 10.0, as a number average, preferably at least 1.5, preferably at least 2; preferably no more than 5.0, preferably no more than 4.0, preferably no more than 3.5. Preferably, the first composition has a refractive index of at least 1.5, preferably at least 1.52, preferably at least 1.54; preferably no greater than 1.7, preferably no greater than 1.65. Preferably, the first composition comprises from 20 to 80 wt % of first polysiloxane(s), preferably at least 60 wt %, preferably at least 35 wt %; preferably no more than 50 wt %, preferably no more than 40 wt %. Preferably, the first composition comprises from 5 to 50 wt % of first compound(s), preferably at least 15 wt %, preferably at least 22 wt %; preferably no more than 40 wt %, preferably no more than 24 wt %. Preferably, the first composition comprises from 5 to 30 wt % of second polysiloxane(s), preferably at least 10 wt %, preferably at least 13 wt %; preferably no more than 20 wt %, preferably no more than 15 wt %.

Preferably, the first composition further comprises a hydrosilylation catalyst, preferably a platinum compound or complex, e.g., $H_2PtCl_6$, di-µ-carbonyldi-π-cyclopentadienyldinickel, a platinum-carbonyl complex, a platinum-divinyltetramethyldisiloxane complex, a platinum cyclovinylmethylsiloxane complex and platinum acetylacetonate (acac). Other typical hydrosilylation catalysts include nickel and rhodium compounds, e.g., $Rh(acac)_2(CO)_2$ and $Ni(acac)_2$. Preferably, the hydrosilylation catalyst is present in the first composition in an amount from 0.1 to 25 ppm, preferably at least 0.5 ppm, preferably at least 1 ppm, preferably at least 2 ppm, preferably at least 3 ppm; preferably no more than 20 ppm, preferably no more than 15 ppm, preferably no more than 10 ppm, preferably no more than 8 ppm.

Preferably, the first composition further comprises an inhibitor for hydrosilylation reaction. Inhibitors for hydrosilylation are well known. The inhibitor provides sufficient for the first composition to be processed without gelation. Examples include 1,3 divinyldisiloxane, $(MeViSiO_{2/2})_4$, 2-methy-3-butynol, 1-ethynyl-1-cyclohexanol. Preferably, the inhibitor is $(MeViSiO_{2/2})_4$. Preferably, the first composition comprises from 0.5 to 1000 ppm of inhibitor(s), preferably at least 1 ppm, preferably at least 2 ppm; preferably no more than 500 ppm, preferably no more than 300 ppm.

Preferably the refractive index of the first composition is at least 0.002 higher than the lower clad.

The second composition comprises: (i) a third polysiloxane comprising epoxy groups, and having a refractive index no greater than 1.49, (ii) at least one second compound comprising at least one epoxy group and having molecular weight no greater than 1000 and a refractive index no greater than 1.49, (iii) at least one $C_3$-$C_{20}$ alcohol having a refractive index no greater than 1.45, and (iv) at least one photo acid generator. Preferably, the third polysiloxane comprising epoxy groups and alkenyl groups comprises 15 to 40 mole % (preferably 18 to 35 mole %, preferably 20 to 32 mole %, preferably 21 to 29 mole %, preferably 22 to 27 mole %) of a unit having formula $R^9R^{10}R^{11}SiO_{1/2}$, wherein $R^9$ and $R^{10}$ independently are $C_1$-$C_{12}$ alkyl, preferably $C_1$-$C_6$ alkyl, preferably $C_1$-$C_4$ alkyl, preferably methyl or ethyl, preferably methyl; and $R^{11}$ is $C_2$-$C_{12}$ alkenyl, preferably $C_2$-$C_6$ alkenyl, preferably $C_2$-$C_4$ alkenyl, preferably vinyl. Preferably, the third polysiloxane comprises from 2 to 20 mole % (preferably 4 to 18 mole %, preferably 5 to 17 mole %, preferably 6 to 15 mole %, preferably 7 to 14 mole %) of a unit having formula $Ar^2SiO_{3/2}$, wherein $Ar^2$ is $C_6$-$C_{20}$ aryl, preferably $C_6$-$C_{15}$ aryl, preferably $C_6$-$C_{12}$ aryl, preferably phenyl. Preferably, the third polysiloxane comprises from 25 to 60 mole % (preferably 30 to 55 mole %, preferably 33 to 50 mole %, preferably 36 to 46 mole %) of a unit having formula $Ep^2SiO_{3/2}$, wherein $Ep^2$ is $C_3$-$C_{20}$ alkyl substituted with an epoxy group, preferably $C_4$-$C_{15}$ alkyl substituted with an epoxy group, preferably $C_5$-$C_{10}$ alkyl substituted with an epoxy group, preferably $C_5$-$C_{10}$ alkyl comprising cyclohexyl fused to an ethylene oxide ring, preferably 2-(3,4-epoxycyclohexyl)ethyl. Preferably, the third polysiloxane comprises from 10 to 40 mole % (preferably 13 to 37 mole %, preferably 16 to 34 mole %, preferably 18 to 32 mole %) of a unit having formula $R^{12}SiO_{3/2}$, wherein $R^{12}$ is $C_1$-$C_{12}$ alkyl, preferably $C_1$-$C_6$ alkyl, preferably $C_1$-$C_4$ alkyl, preferably methyl or ethyl, preferably methyl. Preferably, the second compound comprising at least one epoxy group and having molecular weight no greater than 700 and a refractive index no greater than 1.49 has a molecular weight from 100 to 600, preferably 150 to 530, preferably 200 to 480. Preferably, the compound has at least two epoxy groups, preferably two. Preferably, the second compound has a refractive index no greater than 1.48, preferably no greater than 1.47, preferably no greater than 1.46; preferably at least 1.3, preferably at least 1.35. Preferably, the second compound is a silicon-containing compound, preferably a siloxane compound. Preferably, hydrocarbyl substituents attached to silicon which do not comprise epoxy groups are $C_1$-$C_4$ alkyl groups, preferably methyl. Preferably, the epoxy group is part of a $C_3$-$C_{20}$ alkyl group, preferably $C_4$-$C_{15}$ alkyl, preferably $C_4$-$C_{10}$ alkyl, preferably $C_5$-$C_{10}$ alkyl comprising cyclohexyl fused to an ethylene oxide ring, preferably 2-(3,4-epoxycyclohexyl)ethyl. Preferably, the second compound is 1,3-bis(2-(3,4-epoxycyclohexyl)ethyl) tetramethyldisiloxane. The second composition comprises from 0.5 to 25 wt % of at least one $C_3$-$C_{20}$ alcohol having a refractive index no greater than 1.45. The alcohol may be linear or branched. Preferably, the alcohol has one or two hydroxyl groups, preferably one. Preferably the alcohol is n-decanol.

Preferably, the second composition comprises from 30 to 80 wt % of polysiloxane(s) comprising epoxy groups and alkenyl groups, and having a refractive index no greater than 1.49, preferably at least 50 wt %, preferably at least 55 wt %; preferably no more than 70 wt %, preferably no more than 80 wt %. Preferably, the second composition comprises from 5 to 60 wt % of compound(s) comprising at least one epoxy groups and having molecular weight no greater than 1000 and a refractive index no greater than 1.49, preferably at least 20 wt %, preferably at least 34 wt %; preferably no more than 50 wt %, preferably no more than 40 wt %. Preferably, the second composition comprises from 0.5 to 25 wt % of at least one $C_3$-$C_{20}$ primary alcohol having a refractive index no greater than 1.45, preferably at least 5 wt %, preferably at least 6.5 wt %; preferably no more than 10 wt %, preferably no more than 8 wt %. Preferably, the refractive index of the second composition is at least 0.002 lower than that of the first composition, preferably at least 0.005 lower, preferably at least 0.01 lower, preferably at least 0.015 lower.

The second composition is deposited on the final patterned core layer after a time from 0.01 to 300 hours, preferably at least 20 hours, preferably at least 60 hours, preferably at least 80 hours, preferably at least 100 hours; preferably no more than 250 hours. Preferably, during this wait time the composite is at a temperature from 0 to 60° C., preferably no more than 45° C., preferably no more than 35° C.; preferably at least 10° C., preferably at about room temperature.

Preferably, curing via ultraviolet light is performed at a wavelength from 180 to 450 nm, preferably 300 to 400 nm. Preferably, the dose level is from 5 to 3000 $mJ/cm^2$, preferably from 50 to 2000 $mJ/cm^2$, preferably from 800 to 1800 $mJ/cm^2$. Preferably, a photo acid generator is present in the composition to be cured. Photo acid generators are well known, see, e.g., EP1142928. Examples of classes of photo acid generators are onium salts, diazoketones, sulfones and sulfonates. Onium salts include iodonium salts, sufonium salts, phosphonium salts, diazonium salts and pyridinium salts. Especially preferred photo acid generators include triarylsulfonium salts of sulfonic acids, diaryliodonium salts of perfluoroalkylsulfonic acids, diaryliodonium salts of sulfonic acids, diaryliodonium salts of boronic acids and triarylsulfonium salts of boronic acids.

Preferred solvents for removing uncured material from the composite include, e.g., alcohols (e.g., isopropanol), glycol ether acetates (e.g., diethylene glycol monoethyl ether acetate), toluene, ethers or any organic solvent that can dissolved the uncured first composition.

Preferably, the thickness of the lower clad layer is from 20 to 500 microns, preferably 100 to 200 microns. Preferably, the thickness of the core layer (cured first composition) is from 40 to 70 microns, preferably 45 to 55 microns. Preferably the thickness of the top clad is from 20 to 500 microns, preferably is 100 to 200 microns.

Preferably, the film refraction index of the top layer is at least 0.002 lower than the core film. Preferably the refractive index of the top layer film is at least 0.002 lower than that of the core layer. Preferably the film refractive indexes of the top clad and the lower clad are the same.

Following the UV curing in step (e) of the method of this invention, the cured composite is heated at a temperature from 20 to 210° C. (preferably at least 80° C., preferably at least 100° C., preferably at least 120° C.; preferably no more than 190° C., preferably no more than 175° C.) for at least 0.2 hours; preferably no more than 5 hours, preferably no more than 2 hours, preferably no more than 1 hour.

The compositions of this invention may include optional ingredients such as photosensitizers, fillers, high release additives, reactive diluents, photochromic materials, dyes, colorants, preservatives, and other radiation curable compounds.

EXAMPLES

Example 1

Base formulation that was used to prepare core and clad formulations: A 134.9 g sample of epoxy functional resin that has a $(PhSiO_{3/2})_{0.10}(MeSiO_{3/2})_{0.25}$ $(RSiO_{3/2})_{0.40}$ $(ViMe_2SiO_{1/2})_{0.25}$ formulation (63% solid) was mixed with 50.99 g of 1,3-bis(2-(3,4-epoxycyclohexyl)ethyl) tetramethyldisiloxane and followed by solvent evaporation using a rotary evaporator at 60° C. and 0-1 torr for 2 hours to product a base material.

Core: A 60.43 g of above base formulation was mixed with 0.19 g of CPI 300 photo catalyst (sulfonium salt from Nagase Corp.), 10 g of $HMe_2SiO(Ph_2SiO_{2/2})_{2.5}OSiMe_2H$, 0.0278 g of $(MeViSiO_{2/2})_4$ and 0.16 g of Pt catalyst. The Pt catalyst was prepared by diluting a Karstedt's catalyst (platinum-divinyltetramethyldisiloxane complex) to 0.14% Pt with $HMe_2SiO(Ph_2SiO_{2/2})_{2.5}OSiMe_2H$. After mixing, the solution was filtered through 0.45 micro meter filter. This leads to a composition of: 53.3% epoxy resin, 32.04% 1,3-bis(2-(3,4-epoxycyclohexyl) tetramethyldisiloxane, 14.11% $HMe_2SiO(Ph_2SiO_{2/2})_{2.5}OSiMe_2H$, 0.039% $(MeViSiO_{2/2})_4$, 3.16 ppm Pt and 0.27% CPI 300 (sulfonium salt from Nagase Corp.). The mixture has a RI of 1.5027 (589 nm) and a viscosity of 4800 cPs at 25° C. The mixture was spun coated on a silicon wafer at 4000 rpm for 60 seconds, and the film was cured at 10 mW/cm² UV light for 120 seconds using a high pressure mercury lamp. The resulting film has a thickness of 18.3 micron meter and a refractive index of 1.5135 as measured using Metricon prism coupler at 632.8 nm.

Example 2: Clad Formulation

A 42.40 g of base formulation prepared in example 1 was mixed with 3.08 g of decanol and 0.12 g of CPI 300 catalyst. After mixing, the solution was filtered through filter with a pore size of 0.45 micrometer. This leads to a composition of 58.1% epoxy resin, 34.9% of 1,3-bis(2-(3,4-epoxycyclohexyl)ethyl) tetramethyldisiloxane, 6.75% decanol and 0.26% CPI 300 catalyst. The mixture has a RI of 1.4829 (589 nm) and a viscosity of 1830 cPs at 25° C. The mixture was spun coated on a silicon wafer at 4000 rpm for 30 seconds, the film was cured at 10 mW/cm² UV light for 120 seconds (high pressure mercury lamp). The resulting film has a thickness of 19.54 micron meter and a refractive index of 1.4960 measured using Metricon prism coupler at 632.8 nm.

Example 3: Process to Make Waveguide and Properties

A cladding layer was spun on a silicon wafer at 600 RPM for 12 seconds and subsequently cured at 1.2 J/cm² using a high pressure mercury bulb. A core layer was spin coated at 600 RPM for 10 seconds on the cured cladding layer. The core layer was photo patterned using an 8 inch photo mask with a 50 micron proximity gap. A 250 mJ/cm² dose using a high pressure mercury bulb was used to achieve a 55 micron wide feature. Diethylene glycol monoethyl ether acetate was used to develop the uncured core as well as isopropanol alcohol. A wait time of 148 hours at room temperature was implemented to allow some of the high RI species, $HMe_2SiO(Ph_2SiO_{2/2})_{2.5}OSiMe_2H$, to cure into the patterned core structure. A top cladding layer was spin coated on top of the cured core layer at 600 RPM for 10 seconds. The cladding layer was the UV catalyzed to cure the structure at 1.2 J/cm². The entire waveguide stack was place in a 150° C. oven for 120 minutes.

The invention claimed is:
1. A method for producing an optical waveguide; said method comprising steps of:
   (a) depositing on a substrate a first composition comprising: (i) a first polysiloxane comprising epoxy groups and alkenyl groups, and having a refractive index no greater than 1.49 and containing 7-14 mole % $ArSiO_{3/2}$ groups where Ar is a $C_6$-$C_{10}$ aryl; (ii) at least one first compound comprising at least two epoxy groups and having molecular weight no greater than 1000 and a refractive index no greater than 1.49;
   (iii) a second polysiloxane having $M_n$ from 150 to 1,500, at least one hydrogen atom bonded to a silicon atom and a refractive index of at least 1.50; (iv) at least one photo acid generator; (v) at least one hydrosilylation catalyst, and (vi) at least one inhibitor for hydrosilylation;
   (b) curing the first composition by exposure to ultraviolet light through a mask to produce a patterned core layer comprising a cured portion of the first composition and an uncured portion of the first composition;
   (c) removing at least a part of the uncured portion of the first composition to produce a final patterned core layer;
   (d) after a time from 0.01 to 300 hours, depositing on the final patterned core layer a second composition that has a refractive index at least 0.002 lower than that of the first composition, said second composition comprising: (i) a third polysiloxane comprising epoxy groups, and having a refractive index no greater than 1.49, and (ii) at least one second compound comprising at least two epoxy groups and having molecular weight no greater than 1000 and a refractive index no greater than 1.49; (iii) at least one alcohol; and (iv) at least one photo acid generator to produce a composite and
   (e) curing by exposure to ultraviolet light; and
   (f) holding at a temperature from 20 to 210° C. for 0.1 to 10 hours.

2. The method of claim 1 in which refractive index of the second composition is at least 0.002 lower than that of the first composition.

3. The method of claim 2 in which each of the first compound and the second compound has a refractive index from 1.3 to 1.48.

4. The method of claim 3 in which the first composition comprises from 20 to 80 wt % of at least one first polysiloxane, from 5 to 50 wt % of at least one first compound and from 3 to 30 wt % of at least one second polysiloxane.

5. The method of claim 4 in which the second composition comprises from 30 to 80 wt % of at least one third polysiloxane and from 5 to 60 wt % of at least one second compound and 0.5 to 25 wt % of at least one primary alcohol.

6. The method of claim 5 in which the second polysiloxane comprises at least one D unit having at least one $C_6$-$C_{20}$ aryl substituent.

7. The method of claim 6 in which the first polysiloxane comprises from 25 to 60 mole % of a unit having formula $Ep^1SiO_{3/2}$, wherein $Ep^1$ is $C_3$-$C_{20}$ alkyl substituted with an epoxy group; from 2 to 20 mole % of a unit having formula $Ar^1SiO_{3/2}$, wherein $Ar^1$ is $C_6$-$C_{20}$ aryl; from 15 to 40 mole % of a unit having formula $R^5R^6R^7SiO_{1/2}$, wherein $R^5$ and $R^6$ independently are $C_1$-$C_{12}$ alkyl and $R^7$ is $C_2$-$C_{12}$ alkenyl; and from 10 to 40 mole % of a unit having formula $R^8SiO_{3/2}$, wherein $R^8$ is $C_1$-$C_{12}$ alkyl.

8. The method of claim 7 in which the third polysiloxane comprises from 25 to 60 mole % of a unit having formula $Ep^2SiO_{3/2}$, wherein $Ep^2$ is $C_3$-$C_{20}$ alkyl substituted with an epoxy group; from 2 to 20 mole % of a unit having formula $Ar^2SiO_{3/2}$, wherein $Ar^e$ is $C_6$-$C_{20}$ aryl; from 15 to 40 mole % of a unit having formula $R^9R^{10}R^{11}SiO_{1/2}$, wherein $R^9$ and $R^{10}$ independently are $C_1$-$C_{12}$ alkyl, and $R^{11}$ is $C_2$-$C_{12}$ alkenyl; and from 10 to 40 mole % of a unit having formula $R^{12}SiO_{3/2}$, wherein $R^{12}$ is $C_1$-$C_{12}$ alkyl.

9. The method of claim 8 in which the second polysiloxane has formula $HMe_2SiO(Ph_2SiO_{2/2})_nOSiMe_2H$ in which Ph is phenyl and n is 1.0 to 5.0, as a number average.

10. The method of claim 9 in which $R^7$ and $R^{11}$ are vinyl, $Ar^1$ and $Ar^2$ are phenyl; $R^5$, $R^6$, $R^9$ and $R^{10}$ independently are $C_1$-$C_4$ alkyl; and $Ep^1$ and $Ep^2$ are $C_5$-$C_{10}$ alkyl comprising cyclohexyl fused to an ethylene oxide ring.

\* \* \* \* \*